United States Patent [19]

Enomoto et al.

[11] Patent Number: 4,969,825

[45] Date of Patent: Nov. 13, 1990

[54] ELECTRICAL CONNECTOR

[75] Inventors: Masahiro Enomoto, Inagi; Minoru Fukushima; Masaaki Oya, both of Yokohama, all of Japan

[73] Assignee: Molex Incorporated, Lisle, Ill.

[21] Appl. No.: 413,023

[22] Filed: Sep. 27, 1989

[30] Foreign Application Priority Data

Sep. 30, 1988 [JP] Japan .......................... 63-128738[U]

[51] Int. Cl.$^5$ .............................................. H01R 9/09
[52] U.S. Cl. ........................................ 439/65; 439/80; 439/511; 439/514
[58] Field of Search ....................... 439/65, 76, 78–83, 439/511, 514, 835

[56] References Cited

U.S. PATENT DOCUMENTS

| | | | |
|---|---|---|---|
| 2,870,424 | 1/1959 | Franz | 439/79 |
| 2,958,065 | 10/1960 | Flanagan, Jr. | 439/80 |
| 4,059,320 | 11/1977 | Plaget | 439/511 |
| 4,245,876 | 1/1981 | Ritchie et al. | 439/65 |
| 4,486,066 | 12/1984 | Minter | 439/81 |
| 4,516,817 | 5/1985 | Deters | 439/514 |

Primary Examiner—P. Austin Bradley
Attorney, Agent, or Firm—Louis A. Hecht; Stephen Z. Weiss; Charles S. Cohen

[57] ABSTRACT

An electrical connector used for interconnecting one or more conductors on the same or different printed circuit boards comprising two mold members having terminal bodies with each end inserted into the mold members until they protrude from the bottom and with a bent portion between the mold members maintaining a distance greater than the distance required to insert the mold members and terminal bodies into through holes of a printed circuit board. The connector is used in conjunction with a pair of chuck members and a stop member to place the connector mold members in alignment so that the protruding terminal portions can be accurately inserted into through holes of a printed circuit board with the use of automatic robot means.

7 Claims, 3 Drawing Sheets

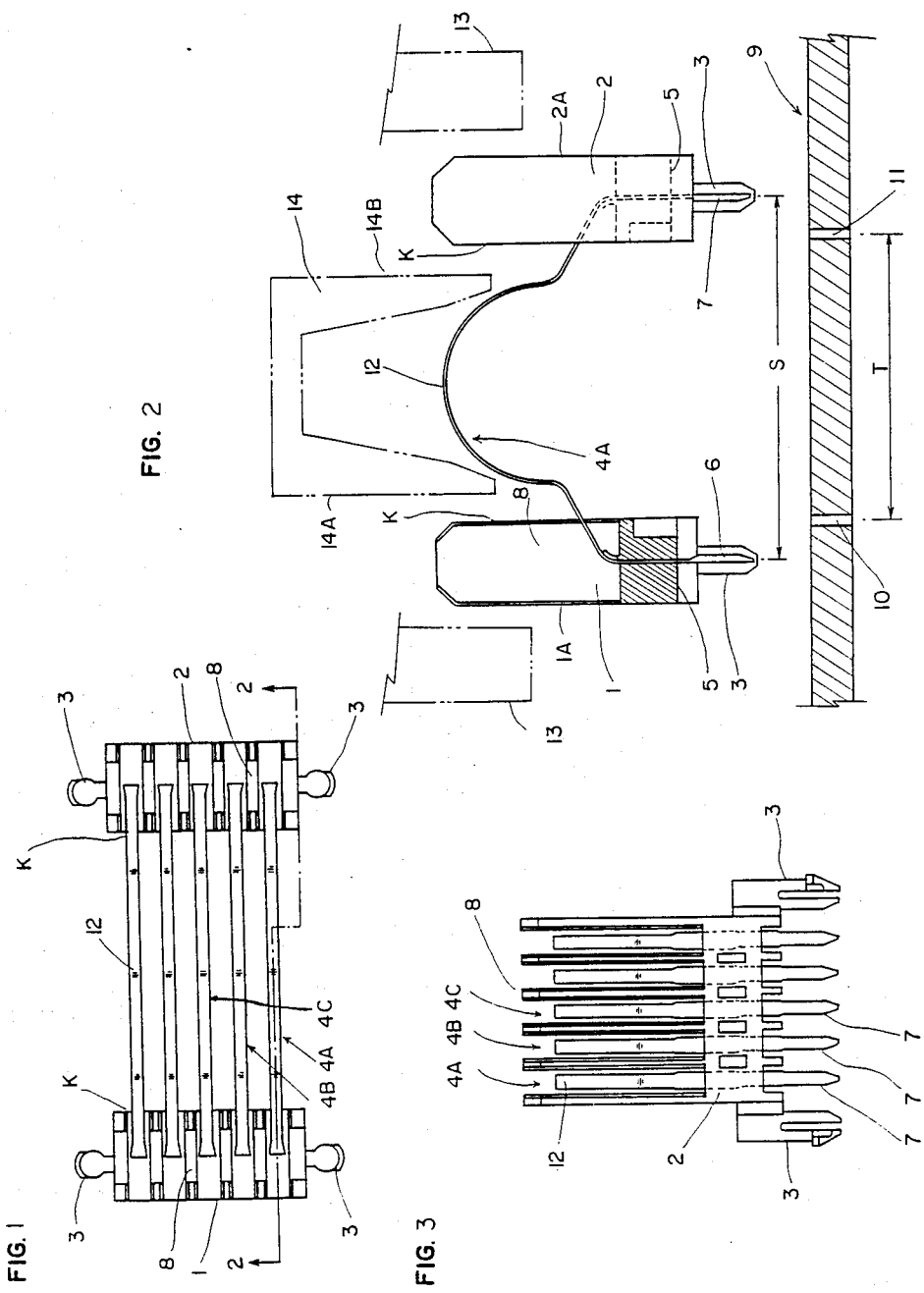

FIG. 6
FIG. 7
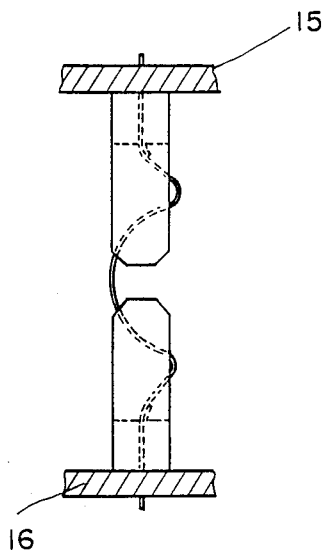
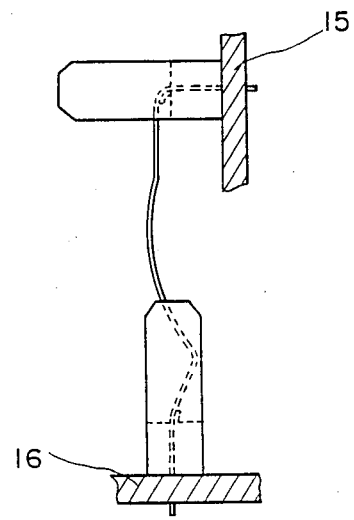

ELECTRICAL CONNECTOR

BACKGROUND OF THE INVENTION

1. Field of the Invention

The present invention relates to an electrical connector, and more particularly to a new and improved electrical connector used for interconnecting conductors on printed circuit boards.

2. Description of the Prior Art

As is well knonw, various kinds of electrical connectors are developed for electrically interconnecting one conductor to another on printed circuit boards.

One such electrical connector comprises a plurality of terminal bodies each consisting of an elongate plate member. The terminal bodies are disposed parallel to each other at a predetermined pitch with both of their end portions inserted through and supported on right and left mold members. Both end portions of the terminal bodies may protrude from bottom surfaces of the mold members and the protruded end portions of the terminal bodies are configured as terminal portions which are adapted for insertion into the through-holes of one or more printed circuit boards. One row of the terminal portions supported on and reinforced by one of the mold members is inserted into one row of the through-holes of the printed circuit board and is soldered thereto. Then, in the similar manner, another row of the terminal portions, also reinforced by the other mold member, is inserted into another row of the through-holes of the printed circuit board and is soldered thereto. In this way, conductors on the printed circuit boards are electrically connected together by use of the electrical connector.

In such type of prior electrical connectors, the terminal bodies, and more specifically, portions of the terminal bodies which extend between a pair of right and left mold members are constructed to be flexible in nature and usually have linear configurations at the time before the terminal portions are inserted into the through-holes of the printed circuit boards. During insertion, a row of terminal portions is inserted into a row of through-holes of one printed circuit board and soldered thereto. Thereafter, another row of terminal portions is inserted into a row of through-holes of the other printed circuit board and soldered thereto. At this time, the terminal bodies are flexibly bent according to the relative positions on the printed circuit boards, thereby capable of making electrical connection between conductors on the printed circuit boards irrespective to said relative position of the circuit boards.

Although the electrical connectors according to the prior art are useful for electrically connecting the conductors on the printed circuit boards, there may still remain the need for improving them in view of the tedious operation of individually inserting the one and other rows of terminal portions into one and other rows of through-holes in the printed circuit boards. In other words, (1) According to the design of prior art electrical connectors as stated above, a row of terminal portions of the terminal bodies is firstly inserted into a row of through-holes of one printed circuit board and soldered thereto, and then after the terminal bodies between the mold members are flexibly bent according to the position of other printed circuit board, another row of terminal portions of the terminal bodies is inserted into a row of through-holes of the other printed circuit board and soldered thereto. Therefore, two positioning operations one for each row of terminal portions with respect to their through-holes of the circuit boards must individually be performed, thereby increasing the number of steps for insertion and requiring a relatively longer period of time;

(2) As stated above, before insertion of each row of the terminal portions into each row of the through-holes of the printed circuit boards, precise positioning of each row of the terminal portions relative to the through-holes must be done. However, because there are no guide means for positioning the prior connectors, reliable insertion of the terminal portions will not occur taking a longer period of time to insert the terminal portions into the through-holes of the circuit boards. This becomes more significant especially in the case where both the terminal portions and the through-holes have small diameters, the pitch of the terminal portions arranged side by side is small, and the distance between both rows of the terminal portions is short; and (3) Recently, such type of insertion operation tends to be automatically performed by a robot. Such an automatic insertion operation, however, becomes more and more complicated because one or the other insertion operation must be individually performed as stated above.

SUMMARY OF THE INVENTION

It is therefore one object of the present invention to provide a new and improved electrical connector having such construction that two rows of terminal portions of the terminal bodies can simultaneously be inserted into two rows of through-holes of the printed circuit board, thereby realizing effective electrical connection of the conductors on the printed circuit board.

It is a object of the present invention to provide an electrical connector comprising a guide means for precisely positioning the terminal portions of the terminal bodies relative to the through-holes of the printed circuit board, thereby producing precise and rapid insertion of the terminal portions into the through-holes of the printed circuit board.

It is a further object of the present invention to provide an electrical connector capable of realizing an automatic insertion operation by a robot.

It is a further object of the present invention to provide an electrical connector adaptable to any type of printed circuit board irrespective of intervals between rows of the through-holes provided therein for insertion of the terminal portions of the terminal bodies.

It is a further object of the present invention to provide an electrical connector having simple construction which enables economical manufacturing and ease of use of the same.

In order to achieve the objects as stated above, the present invention provides a new and improved electrical connector having a plurality of terminal bodies (4A, 4B, 4C . . . ) each consisting of an elongate plate member, with the terminal bodies (4A, 4B, 4C . . . ) being disposed side by side at a predetermined pitch with their both end portions inserted through and supported in right and left mold members (1 and 2) which are separated from each other both end portions of the terminal bodies protruding from bottom surfaces of said mold members (1 and 2), said protruded end portions of the terminal bodies being configured as terminal portions (6 and 7) which are adapted for insertion into through holes (10 and 11) provided in a printed circuit board (9), one row of the terminal portions (6) supported on and reinforced by one of the mold members (1) being inserted into one row of the through-holes (10) of the printed circuit board (9) and then another row of the terminal portions (7) also supported on and reinforced by one of the other mold members (2) being inserted into another row of said though-holes (11) of the printed circuit board (9), thereby electrically connecting the conductors on the printed circuit board (9) characterized in that:

at the time both rows of the terminal portions of the terminal bodies are not still inserted into the corresponding ones of the through-holes of the printed circuit board (9), a distance "S" between both rows of the terminal portions (6 and 7) of the terminal bodies is made greater than an interval "T" between both rows of the through-holes of the printed circuit board (9) due to restoring elasticity of the bent portions (12) of the terminal bodies which extend between the pair of right and left mold members (1 and 2); and at the time both rows of the terminal portions of the terminal bodies are to be inserted into the corresponding ones of the through-holes of the printed circuit board (9), a pair of chuck members (13) each positioned outside of the pair of right and left mold members (1 and 2) are actuated to move the pair of right and left mold members (1 and 2) towards each other until opposite walls "K" of the mold members (1 and 2) are abutted against walls (14A and 14B) of a stop member (14) positioned between the right and left mold members (1 and 2), upon which the distance "S" between both rows of the terminal portions of the terminal bodies (4A, 4B, 4C . . . ) matches with the interval "T" between both rows of the through-holes of the printed circuit board (9), thereby enabling simultaneous insertion of both rows of the terminal portions (6 and 7) of the terminal bodies (4A, 4B, 4C . . . ) into both rows of the through-holes of the printed circuit board (9).

According to the arrangement of the electrical connector as stated above, before the rows of terminal portions of the terminal bodies are inserted into the corresponding through-holes of the printed circuit board, the bent portions (12) of the terminal holes are kept in their expanded states due to their restoring elastic forces so that the distance "S" between two rows of the terminal portions is made greater than the interval "T" between two rows of the through-holes of the printed circuit board. Thus, in order to insert both rows of the terminal portions (6 and 7) into the corresponding rows of through-holes of the circuit board, the bent portions (12) of the terminal bodies are squeezed by means of the pair of right and left chuck members (13) and the stop member (14). In other words, the pair of right and left mold members (1 and 2) are moved towards each other by means of the pair of chuck members (13), thereby decreasing the spacing between both rows of terminal portions (6 and 7) until the opposite walls "K" of the pair of mold members (1 and 2) abut against the walls (14A and 14B) of the stop members (14). At this time, the distance "S" between both rows of terminal portions matches the interval "T" as defined above. Therefore, simply forcing the entire electrical connector towards the printed circuit board enables ease and reliable insertion of both rows of the terminal portions (6 and 7) into both rows of the through-holes (10 and 11) of the printed circuit board (9). Thereafter, the terminal portions (6 and 7) are soldered to the associated conductors on the printed circuit board (9) to achieve the electrical connection therebetween.

According to another embodiment of the present invention, the flexible characteristics of the terminal bodies can be utilized to electrically connect the conductors on different printed circuit boards irrespective of relative positions thereof.

It is to be understood from the foregoing that the present invention provides guide means for positioning both rows of the terminal portions so that the distance between them matches the interval between both rows of the through-holes of the printed circuit board, thereby achieving the precise, rapid and simultaneous insertion of both rows of the terminal portions into both rows of the through-holes of the printed circuit board, as well as realizing an automatic insertion by a robot.

Embodiments of the present invention will now be described by way of example with reference to the accompanying drawings in which:

FIG. 1 is a top plane view of the electrical connector according to the present invention;

FIG. 2 is a cross-sectional view taken along the line 2—2 in FIG. 1 showing a step before the terminal portions of the terminal bodies arranged in two parallel rows are inserted into their associated through-holes also arranged in two parallel rows of the printed circuit board;

FIG. 3 is a side view of the electrical connector shown in FIG. 1 as viewed from the right hand side thereof;

FIGS. 6 and 7 show two examples representing another application of the electrical connector different from that shown in FIGS. 2 and 4 in that two separate printed circuit boards are electrically connected to each other by utilizing the deformability characteristics of the terminal bodies.

PREFERRED EMBODIMENT OF THE INVENTION

Figure 4:
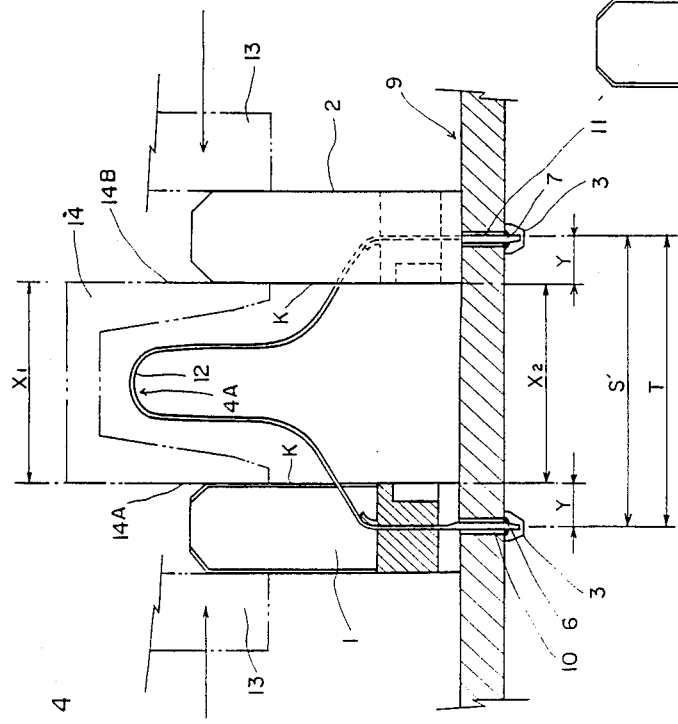
FIG. 4 is a cross-sectional view similar to FIG. 2 but showing a step after the terminal portions of the terminal bodies have been inserted into the associated through-holes of the printed circuit board.

In the drawings, reference numerals 1 and 2 denote a set of right and left mold members separated from each other. The mold members 1 and 2 have lock pieces 3 integrally formed on their front and rear ends, respectively. A plurality of terminal bodies 4A, 4B, 4C . . . each consisting of an elongate flexible plate member are disposed in parallel at a predetermined pitch between these mold members 1 and 2. More particularly, one end of the terminal body 4A is inserted through and supported on one mold member 1. As shown in FIG. 2, this end of the terminal body 4A protrudes beyond the bottom surface 5 of the mold member 1 and forms one terminal portion 6. Similarly, the other end of the terminal body 4A is also inserted through and supported on the other mold member 2. The other end of the terminal body also protrudes beyond the bottom surface 5 of the mold member 2 and forms another terminal portion 7. As a consequence, both ends 6 and 7 of the terminal bodies 4A, 4B, 4C . . . are structurally reinforced by their associated mold members 1 and 2.

In addition, with reference to the parallel arrangement of the terminal bodies 4A, 4B, 4C . . . , partition walls 8 are integrally formed between portions of the mold members 1 and 2 on which the terminal bodies 4A, 4B, 4C . . . are supported. A printed circuit board is represented by a reference numeral 9 and is provided with through-holes 10 and 11 into which said terminal portions 6 and 7 are inserted, and with lock holes (not shown) into which the lock pieces 3 are fitted. It is to be noted that in FIG. 2, one set of the through-holes 10 and 11 are only shown, but a plurality of these through-holes 10 and 11 are actually provided in parallel rows.

Figure 5:
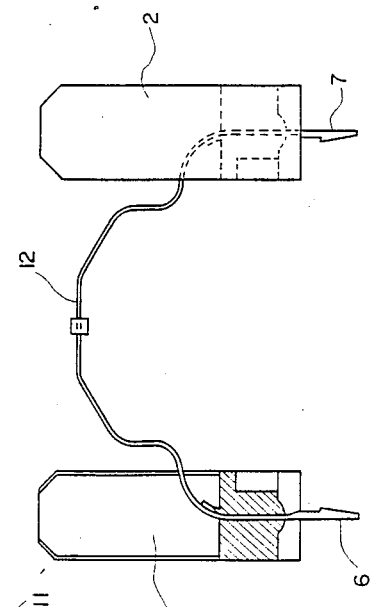
FIG. 5 shows another embodiment of the electrical connector according to the present invention.

Described thus far is a conventional electrical connector for interconnecting one conductor to another conductor on a printed circuit board. In contrast with this, for the purpose of achieving the objects of the present invention described earlier, the electrical connector according to the present invention is constructed as described below. In other words, assuming that "T" is an interval between one row of the through-holes 10 and another row of the through-holes 11 which are provided in the printed circuit board 9, and "S" is a distance between one of the terminal portions 6 reinforced by one mold member 1 and the corresponding terminal portions 7 reinforced by the other mold member 2 at the time before these terminal portions are not still inserted into the through-holes of the circuit board, then the connector is constructed such that the relation $S > T$ can be maintained. More particularly, terminal portion 6 is held approximately perpendicular to the printed circuit board 9 in order to insert the terminal portion 6 into one of the through-holes 10 in one row. And at the same time, the terminal portion 7 is also held approximately perpendicular to the cirucit board 9 so that the terminal portion 7 can be inserted into one of the through-holes 11 in other row. However, the relation $S > T$ can still be maintained due to the restoring resilience of a portion 12 of the terminal body supported on a pair of mold members 1 and 2. According to this embodiment, the portion 12 of the terminal body is shaped as a semi-circular bent portion. Alternatively, the portion 12 of the terminal body may be shaped as shown in FIG. 5 or may have an inverted V-shaped or a M-shaped bent portion. In addition to the body portion of the electrical connector, the invention further comprises a pair of chuck members 13 for squeezing the bent portion 12 in a predetermined manner and a stop member 14. The pair of chuck members 13 are disposed outside the pair of mold members 1 and 2, are abutted against the side walls 1A and 2A of the mold members 1 and 2, and are brought closer to each other, thereby reducing the spacing between the mold members 1 and 2, which collapses the bent portion 12 of the terminal body so that the distance S between the end portions 6 and 7 is decreased. However, in order to limit the squeezing effect of the chuck members 13, the stop member 14 having stop walls 14A and 14B is disposed between the pair of mold members 1 and 2. The stop member 14 is dimensioned so that when the distance "S" between the end portions 6 and 7 becomes equal to "S'" which corresponds to the interval "T" between the through-holes 10 and 11, the stop walls 14A and 14B of the stop member 14 abut against the opposite walls K of the mold members 1 and 2, respectively, thereby limiting further the squeezing effect of the chuck members 13.

The electrical connector constructed according to the embodiment described above is operated as follows. Under the unmounted condition of the electrical connector, the distance "S" between end portions 6 and 7 of the terminal body is made greater than the interval "T" between the through-holes 10 and 11 of the printed circuit board 9 due to the restoring elasticity of the bent portion 12 of each terminal body 4A, 4B, 4C . . . When the electrical connector is to be mounted on the printed circuit board 9, the end portions 6 and 7 of the terminal body are positioned facing directly towards the printed circuit board 9 as shown in FIG. 2. Then, the pair of chuck members 13 and the stop member 14 are actuated before performing insertion of the end portions 6 and 7 into the through-holes 10 and 11 of the circuit board 9. More precisely, the pair of chuck members 13 are abutted against the side walls 1A and 2A of the mold members 1 and 2. Thereafter, the squeezing action of the chuck members 13 brings the mold members 1 and 2 closer to each other, thereby reducing the distance between mold members 1 and 2 and thus further deforming the bent portion 12 of the terminal body. Eventually, the stop walls 14A and 14B of the stop member 14 abut against the opposite walls K of the mold members 1 and 2, respectively, which terminates the squeezing action of the chuck members. At this time, the distance "S'$\pm$" between the end portions 6 and 7 of the terminal body becomes equal to the interval "T" between the through-holes 10 and 11 of the printed circuit board 9. This enables the simultaneous smooth insertion of the end portions 6 and 7 of all the terminal bodies into the through-holes 10 and 11 of the printed circuit board 9 by only forcing the mold members 1 and 2 downwards. Thereafter, the end portions 6 and 7 can be soldered to the conductors on the printed circuit board 9.

Selection of the stop member 14 is effected as follows. The values of "T" and "S'" as well as "Y" which is the distance between the walls K of the mold members 1 and 2 and the centers of end portions 6 and 7 are initially known. Thus the spacing X2 between the opposite walls K of the mold members are obtained by subtracting 2"Y" from "S" which equals to "T". Accordingly, it is easy to select the most suitable stop member 14 whose width "X1" is equal to the spacing "X2". In other words, before mounting the electrical connector on the printed circuit board, the stop member 14 can be selected according to the interval "T" between the through-holes 10 and 11 of the printed circuit board 9. Further, the stop member 14 must be constructed to have a shape that prevents the engagement of the stop member 14 with the bent portion 12 of the terminal body when it is subjected to the squeezing action of the chuck members 13 because at such time, the stop walls 14A and 14B of the stop member 14 are forced into abutment against the opposite walls K of the mold members 1 and 2.

FIGS. 6 and 7 show another application of the present electrical connector wherein two printed circuit boards 15 and 16 are electrically connected to each other due to the deformability of the terminal bodies 4A, 4B, 4C . . . that can be bent according to relative positions of both printed circuit boards 15 and 16. In this regard, the electrical connector can be adaptable to a wide range of printed circuit boards provided that the interval "T" between through-holes of the boards is less than the distance "S'" between end portions of the terminal body.

Thus, it is apparent from the foregoing that the electrical connector according to the present invention provides several advantageous effects as stated below.

(1) Both end portions of both rows of the terminal bodies can simultaneously be inserted into both rows of the through-holes of the printed circuit board so that the effective insertion operation of the connector can be achieved;

(2) In such insertion operation, the end portions of both rows of the terminal bodies can precisely be guided into the associated respective through-holes of printed circuit board, thereby achieving precise and rapid positioning and thus insertion of the electrical connector;

(3) An automatic insertion operation by a robot mechanism can easily be realized;

(4) The electrical connector according to the present invention can be adaptable to any type of the printed circuit board irrespective of intervals between rows of the through-holes provided therein for insertion of the terminal portions of the terminal bodies; and (5) The electrical connector according to the present invention has simple construction which enables economical manufacturing and easy use of the connector.

Other modifications of this invention may become apparent to those skilled in the art. Therefore, the scope of this invention is to be limited only by the following claims:

What we claim is:

1. An electrical connector having a plurality of terminal bodies and a pair of mold members separated from each other, having lock pieces protruding from the bottom surface of said mold members, each one of said terminal bodies consisting of an elongate plate member being disposed side by side at a predetermined pitch and two end portions with one end portion inserted through and supported in one mold member, said end portions of the terminal bodies protruding from a surface of said mold member, said protruded lock pieces of said mold members being configured to be adapted for insertion into through-holes provided in a printed circuit board to hold said mold member to said circuit board, characterized in that:

at the time said protruded lock pieces of the mold members are not inserted into the corresponding through-holes of the printed circuit board, a distance between the protruded lock pieces on the respective mold members is greater than a distance between said through-holes of the printed circuit board due to the restoring elasticity of bent portions of said terminal bodies which extend between said pair of mold members, said electrical connector designed so that when a pair of chuck members each positioned outside of said pair of mold members are actuated to move said pair of mold members towards each other, the opposite walls of said mold members abut against the outer walls of a stop member positioned between said mold members, upon which the distance between said lock pieces on the respective mold members matches the distance between the through-holes of the printed circuit board,, thereby enabling simultaneous insertion of both lock pieces on each of said pair of mold members into said through-holes of the printed circuit board.

2. An electrical connector according to claim 1, wherein said end portions of said terminal bodies protrude from the bottom surface of said mold members and are configured to be adapted for insertion into through holes provided in said printed circuit board whereby the end portions on one mold member and the end portions on the other mold member may be simultaneously inserted into the through holes of the printed circuit board at the same time said lock pieces are inserted.

3. An electrical connector according to claim 1, wherein said bent portion is semi-circular.

4. An electrical connector according to claim 1, wherein said bent portion is inverted V-shaped.

5. An electrical connector according to claim 1, wherein said bent portion is M-shaped.

6. An electrical connector according to claim 1, wherein one row of the through-holes and the other row of the through-holes are formed on the same printed circuit board so that the conductors on the same printed circuit board can be electrically connected.

7. An electrical connector according to claim 1, wherein one row of the through-holes and the other row of the through-holes are formed on different printed circuit boards to that the conductors on these different printed circuit boards can be electrically connected.

* * * * *